United States Patent
Woodman et al.

(10) Patent No.: US 11,925,009 B2
(45) Date of Patent: Mar. 5, 2024

(54) ADAPTIVE DESIGN AND FABRICATION OF RADIATION SHIELDING INSERTS FOR ELECTRONIC COMPONENTS

(71) Applicant: Hamilton Sundstrand Corporation, Charlotte, NC (US)

(72) Inventors: Darren Woodman, North Granby, CT (US); Phong Dinh, West Simsbury, CT (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 25 days.

(21) Appl. No.: 17/195,978

(22) Filed: Mar. 9, 2021

(65) Prior Publication Data

US 2022/0295677 A1   Sep. 15, 2022

(51) Int. Cl.
*H05K 9/00*   (2006.01)
*H01Q 17/00*   (2006.01)

(52) U.S. Cl.
CPC ......... *H05K 9/0033* (2013.01); *H01Q 17/007* (2013.01); *H01Q 17/008* (2013.01); *H05K 9/0049* (2013.01)

(58) Field of Classification Search
CPC ... H05K 9/0018; H01Q 17/007; H01Q 17/008
See application file for complete search history.

(56) References Cited

U.S. PATENT DOCUMENTS

| | | | |
|---|---|---|---|
| 5,841,067 A * | 11/1998 | Nakamura | H05K 9/0045 174/382 |
| 8,661,653 B2 | 3/2014 | Thomsen, III et al. | |
| 10,255,382 B1 | 4/2019 | Lauenstein et al. | |
| 10,282,499 B2 | 5/2019 | Badali et al. | |
| 10,772,246 B2 | 9/2020 | Speaker et al. | |
| 2002/0067313 A1 * | 6/2002 | Kondoh | H01L 23/552 257/E23.114 |
| 2005/0051349 A1 * | 3/2005 | Applebaum | H01L 23/10 257/E23.185 |

(Continued)

FOREIGN PATENT DOCUMENTS

| | | |
|---|---|---|
| EP | 0484853 A1 | 5/1992 |
| JP | 10268088 A | 10/1998 |

(Continued)

OTHER PUBLICATIONS

Buchner et al., "Proton Test Guideline Development—Lessons Learned", NASA Electronic Parts and Packaging (NEPP) Program Electronics Radiation Characterization (ERC) Project and Defense Threat Reduction Agency, Aug. 22, 2002, pp. 1-69.

(Continued)

*Primary Examiner* — Hung V Ngo
(74) *Attorney, Agent, or Firm* — CANTOR COLBURN LLP

(57) ABSTRACT

A method includes obtaining a base housing for electronic components. The base housing attenuates radiation entering the base housing by a base amount. An inner volume of the base housing defined by an inner surface of the base housing experiences attenuated radiation. The method also includes affixing one or more inserts to the inner surface of the base housing to further attenuate the attenuated radiation in corresponding one or more areas of the inner volume.

15 Claims, 3 Drawing Sheets

(56) References Cited

U.S. PATENT DOCUMENTS

| | | | |
|---|---|---|---|
| 2013/0027255 A1* | 1/2013 | Ito .................... | H05K 9/0022 |
| | | | 343/702 |
| 2019/0008079 A1* | 1/2019 | Kondo ................ | H05K 1/0216 |
| 2020/0024394 A1 | 1/2020 | Hanson et al. | |
| 2020/0411449 A1 | 12/2020 | Chuang et al. | |
| 2022/0007553 A1* | 1/2022 | Koyama .............. | D06M 11/83 |

FOREIGN PATENT DOCUMENTS

| | | | |
|---|---|---|---|
| JP | 2002-9483 | * | 1/2002 |
| WO | 2020041320 A1 | | 2/2020 |

OTHER PUBLICATIONS

Extended European Search Report for EP Application No. 22154691.4, dated Jul. 7, 2022, pp. 1-8.

* cited by examiner

ADAPTIVE DESIGN AND FABRICATION OF RADIATION SHIELDING INSERTS FOR ELECTRONIC COMPONENTS

BACKGROUND

Exemplary embodiments pertain to the art of radiation shielding for electronic components and, in particular, to adaptive design and fabrication of radiation shielding inserts for electronic components.

Radiation shielding generally refers to thermal shielding, biological shielding, or instrument shielding. Instrument shielding protects electronic components from the effects of radiation. Electronic components housed within a spacecraft may experience radiation from protons and electrons trapped near the Earth's surface, solar particles, or galactic cosmic rays that are generally filtered by the earth's atmosphere and, thus, are not a concern in terrestrial applications. A total ionizing dose (TID), which is an absorbed dose in a given material (e.g., silicon) due to energy deposition of ionizing radiation, and a total nonionizing dose (TNID), which results in cumulative parametric degradation that can lead to the failure of components, can result from the radiation.

BRIEF DESCRIPTION

In one embodiment, a method includes obtaining a base housing for electronic components. The base housing attenuates radiation entering the base housing by a base amount. An inner volume of the base housing defined by an inner surface of the base housing experiences attenuated radiation. The method also includes affixing one or more inserts to the inner surface of the base housing to further attenuate the attenuated radiation in corresponding one or more areas of the inner volume.

Additionally or alternatively, in this or other embodiments, the method also includes identifying the one or more areas of the inner volume based on performing an analysis that considers a position and orientation of the base housing within a spacecraft.

Additionally or alternatively, in this or other embodiments, the performing the analysis considers a direction from which the radiation reaches the base housing.

Additionally or alternatively, in this or other embodiments, the method also includes designing one of the one or more inserts to shield one of the electronic components that are placed in one of the one or more areas.

Additionally or alternatively, in this or other embodiments, the designing the one of the one or more inserts includes determining a shape and position such that the one of the one or more inserts is between the direction from which the radiation reaches the base housing and the one of the electronic components.

Additionally or alternatively, in this or other embodiments, the designing the one of the one or more inserts includes determining a thickness to attenuate the attenuated radiation to a predetermined level.

Additionally or alternatively, in this or other embodiments, the designing the one of the one or more inserts includes designing a pattern on a surface to create a tortuous path that further attenuates the attenuated radiation.

Additionally or alternatively, in this or other embodiments, the method also includes fabricating the one or more inserts from aluminum, stainless steel, or titanium.

Additionally or alternatively, in this or other embodiments, the method also includes fabricating the one or more inserts by implementing additive manufacturing.

Additionally or alternatively, in this or other embodiments, the affixing the one or more inserts includes inserting a fastener through the base housing and into the one or more inserts.

In another embodiment, a housing for electronic components includes a base housing to attenuate radiation entering the base housing by a base amount. An inner volume of the base housing defined by an inner surface of the base housing experiences attenuated radiation. The housing also includes one or more inserts affixed to the inner surface of the base housing to further attenuate the attenuated radiation in corresponding one or more areas of the inner volume.

Additionally or alternatively, in this or other embodiments, each of the one or more inserts is between a direction from which the radiation reaches the base housing and the corresponding one of the one or more areas of the inner volume.

Additionally or alternatively, in this or other embodiments, the base housing comprises aluminum, stainless steel, or titanium.

Additionally or alternatively, in this or other embodiments, the one or more inserts comprises stainless steel, aluminum, or titanium.

Additionally or alternatively, in this or other embodiments, one of the one or more inserts includes a pattern on a surface of the one of the one or more inserts.

Additionally or alternatively, in this or other embodiments, the one or more inserts are fabricated using additive manufacturing.

Additionally or alternatively, in this or other embodiments, the one or more inserts are affixed to the base housing by a fastener inserted through the base housing and into the one or more inserts.

BRIEF DESCRIPTION OF THE DRAWINGS

The following descriptions should not be considered limiting in any way. With reference to the accompanying drawings, like elements are numbered alike.

DETAILED DESCRIPTION

Figure 1:
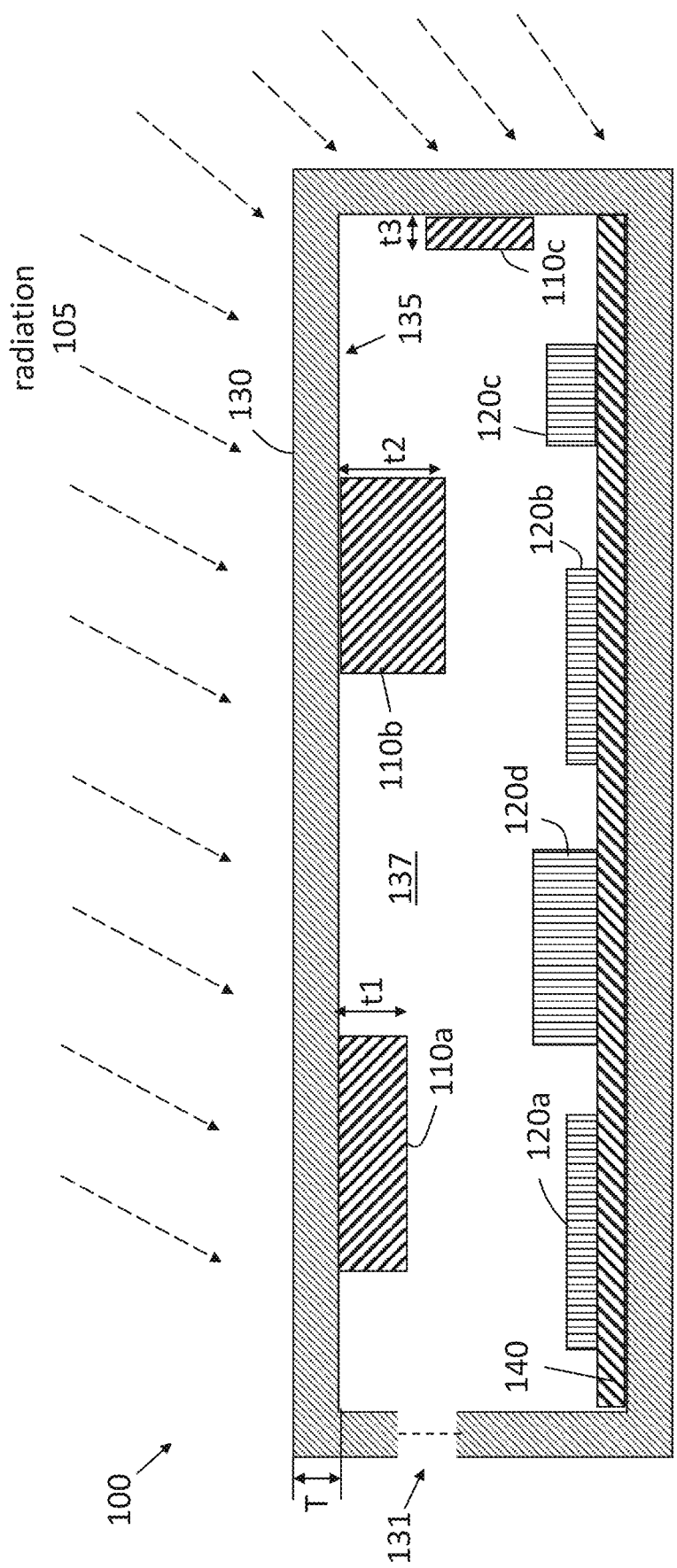
FIG. 1 is a cross-sectional view of an exemplary electronic assembly that shows radiation shielding inserts that are adaptively generated according to one or more embodiments.

A detailed description of one or more embodiments of the disclosed apparatus and method are presented herein by way of exemplification and not limitation with reference to the Figures.

As previously noted, electronic components in spacecraft are susceptible to radiation effects that can lead to component failure. Exemplary failures include an increase in leaky current in n-type metal-oxide-semiconductor (NMOS) transistors that decreases the requisite gate voltage, an increase in the required gate voltage for p-type metal-oxide-semiconductor (PMOS) transistors, and reduced gain in bipolar junction transistors. Mitigation of radiation effects on susceptible components according to prior approaches includes the use of radiation hardened components, the use of component-specific shields, and the use of a shielded housing. A radiation-hardened component results from design and manufacturing variations from the non-hardened equivalent. These variations are not only costly but the testing and development required may also prevent the use of the most recent advances. Radiation shielding attenuates the radiation. Component-specific shields are sized to cover an entire radiation-susceptible component and are placed on the circuit board over the component. As such, these shields must be designed in consideration of vibration and other effects on the circuit board. When implemented in the form of a housing, according to prior approaches, the shielding must be designed in consideration of the most susceptible component within the housing. As a result, the shielding may be over-designed for all other components and, consequently, be costlier and heavier than necessary.

Embodiments of the systems and methods detailed herein relate to adaptive design and fabrication of radiation shielding inserts for electronic components. The radiation shielding inserts address issues noted for prior approaches. Rather than replacing prior approaches, the radiation shielding inserts may be used in conjunction with one or more prior approaches to yield the lowest-weight and lowest-cost solution. For example, while radiation hardening may be unavailable for some components, radiation hardening of some components may still be implemented. However, that radiation hardening may be for lower levels of radiation than expected in order to reduce the cost of the radiation-hardened components. Then, the radiation shielding inserts may be used to provide the radiation attenuation needed to reduce the expected levels of radiation to the lower levels of radiation for which the radiation-hardened components are designed. As another example, a shielded housing may be designed for electronic components that are less susceptible to radiation effects rather than for the most susceptible components. This allows the standard shielded housing to be less thick and, consequently, less heavy. Then, radiation shielding inserts may be used to provide additional shielding only where needed.

According to one or more embodiments, a standard shielded housing is adaptively modified. The standard shielded housing may meet the basic structural, thermal, and vibration requirements for the set of electronic components within. The radiation and, thus, the TID and TNID to which electronic components in the housing are subjected are highly dependent on location within a spacecraft and within the housing at a given location of the spacecraft. Thus, an analysis is performed based on the planned location and arrangement of electronic components, as well as their specific susceptibility which may be affected by any radiation hardening. The analysis facilitates identification of specific components for which the standard shielding of the housing is insufficient. This information may then be used to adaptively determine the shape and placement of shielding inserts to sufficiently shield those components. As detailed, the shape and placement of shielding may be customized for each susceptible component to mitigate overdesign, which adds weight and cost unnecessarily. Each adaptively designed radiation shield insert may then be fabricated using, for example, additive manufacturing (i.e., three-dimensional printing). Unlike the component-specific shields that are placed on the circuit board itself, the inserts are affixed to the standard housing.

FIG. 1 is a cross-sectional view of an exemplary electronic assembly 100 that shows radiation shielding inserts 110 that are adaptively generated according to one or more embodiments. A shielded housing 130 houses a circuit board 140 with electronic components 120a, 120b, 120c, 120d (generally referred to as 120). The shielded housing 130 is not sealed. Instead, the shielded housing 130 may have areas 131 that are cut out for connectors and the like. Radiation shielding inserts 110a, 110b, 110c (generally referred to as 110) are shown affixed to an inner surface 135 of the housing 130. The inner surface 135 of the shielded housing 130 defines the volume 137 within the shielded housing 130. The radiation shielding inserts 110 extend from the inner surface 135 into the volume 137 of the shielded housing 130. The electronic assembly 100 is subjected to radiation 105 in the direction indicated by the arrows in the exemplary case illustrated in FIG. 1. Based on the placement of the electronic assembly 100 (e.g., in a particular location within a spacecraft), the direction and levels of radiation 105 that the electronic assembly 100 will be subjected to are assumed to be known.

The shielded housing 130 may be fabricated from aluminum, for example, to provide a standard level of attenuation of the radiation 105. The shielded housing 130 may alternately be fabricated from stainless steel, titanium, or another conductive material. The material of the shielded housing 130 and its thickness T may be selected according to the weight associated with a desired level of attenuation of the radiation 105. That is, the material of the shielded housing 130 is selected by balancing considerations of weight, which is regarded as a launch cost in the spacecraft application, with attenuation, whose increase comes with an increase in weight for a given material. The resulting level of attenuation (i.e., the standard attenuation provided by the shielded housing 130) may be such that many or most of the components 120 do not require additional shielding via the radiation shielding inserts 110, for example.

The level of attenuation provided by the shielded housing 130 may be insufficient to attenuate all of the TID and TNID caused by the radiation 105. In addition, as previously noted, the shielded housing 130 may include areas 131 without any shielding (e.g., the cut-outs for connectors) such that some components 120 are subjected to incident radiation 105 that is not attenuated at all by the shielded housing 130. Some of the components 120 (e.g., component 120d) may not be susceptible to failure based on the radiation 105 within the shielded housing 130. Other components 120 (e.g., components 120a, 120b, 120c) may be susceptible to failure to different degrees. For example, component 120b may be more sensitive to radiation 105 that enters the housing 130 (i.e., is unattenuated by the shielded housing 130) than component 120a. This may be due to the characteristics and composition of the component 120b, as well as its position on the circuit board 140 relative to the incident direction of the radiation 105.

The radiation shielding insert 110a is designed and positioned on the inner surface 135 of the shielded housing 130 to further attenuate radiation 105 that is not attenuated by the shielded housing 130 before it reaches the component 120a. Similarly, radiation shielding insert 110b is designed and positioned to shield component 120b, and radiation shielding insert 110c is designed and positioned to shield component 120c. In the exemplary case of the component 120b being more susceptible to failure due to radiation 105 than component 120a, the radiation shielding insert 110b has a thickness t2 that is greater than the thickness t1 of the radiation shielding insert 110a. The customizable dimensions of the radiation shielding inserts 110 helps avoid over-shielding and the associated unnecessary weight and cost. As FIG. 1 indicates, the radiation shielding insert 110c with a thickness t3 is affixed to a side of the inner surface 135 rather than a top of the inner surface 135 of the shielded housing 130. Generally, the radiation shielding inserts 110 may be affixed to any inner surface 135 of the shielded housing 130.

Figure 2:
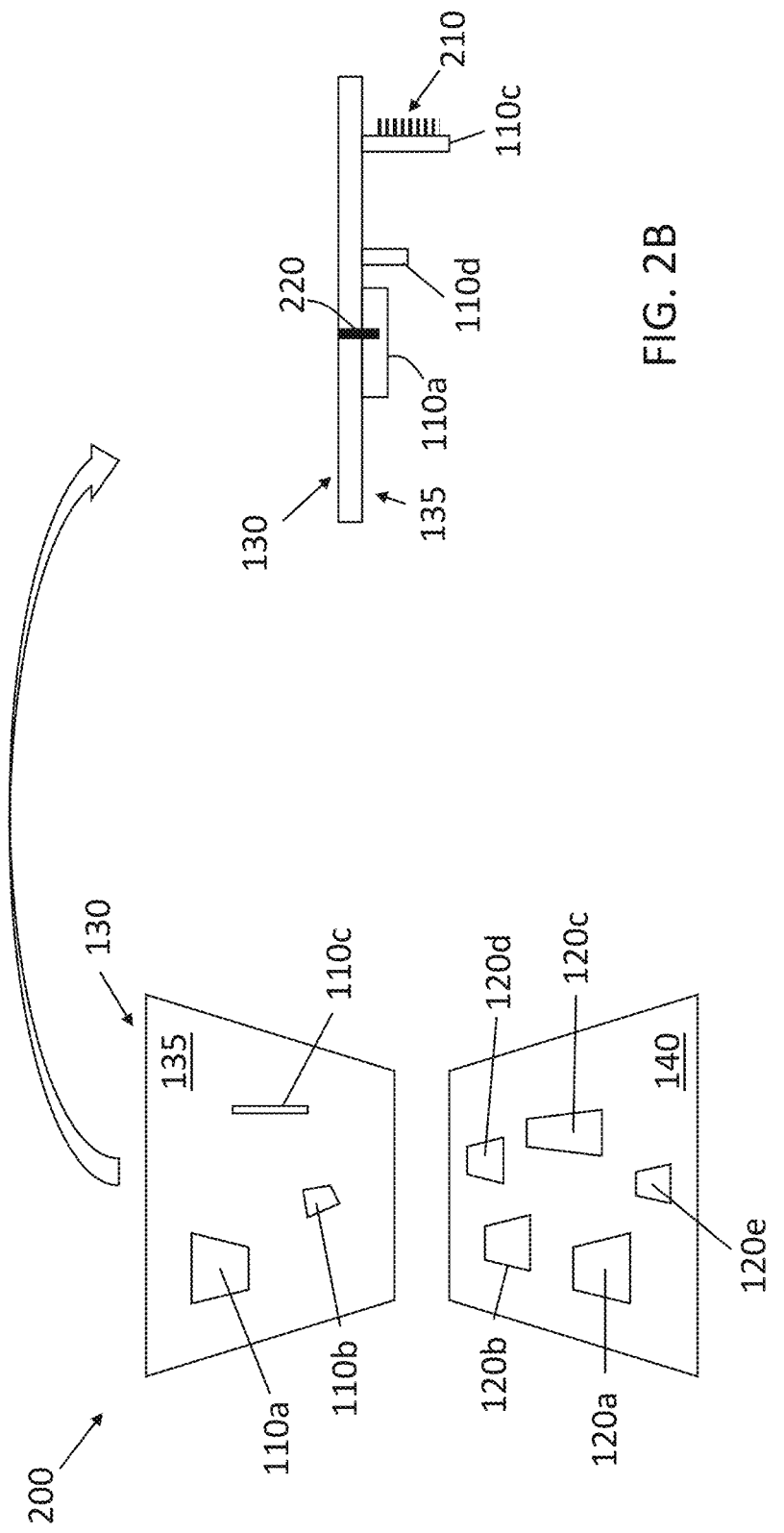
FIG. 2A shows an aspect of an exemplary electronic assembly that includes radiation shielding inserts that are adaptively generated according to one or more embodiments.
FIG. 2B shows another aspect of an exemplary electronic assembly that includes radiation shielding inserts that are adaptively generated according to one or more embodiments.

FIGS. 2A and 2B show aspects of an exemplary electronic assembly 200 that shows radiation shielding inserts 110 that are adaptively generated according to one or more embodiments. The view shown in FIG. 2A is of the inner surface 135 of the top of the shielded housing 130 and the circuit board 140 with components 120. Five components 120a, 120b, 120c, 120d, 120e are shown. On the inner surface 135, three radiation shielding inserts 110a, 110b, 110c are shown. As further discussed with reference to FIG. 3, each of the radiation shielding inserts 110 is customized based on the component 120 that it is shielding (e.g., the attenuation required, the size of the component 120). The shape of the radiation shielding insert 110a matches the shape of the component 120a that it protects. However, this is not necessary, as radiation shielding inserts 110b and 110c indicate. Further, Radiation shielding insert 110b also illustrates that the shape may be irregular. This is made easier by the additive manufacturing process that is used to fabricate the radiation shielding inserts 110.

Because each radiation shielding insert 110 may be shaped to exactly match and block (i.e., attenuate) the incident radiation 105 that is not attenuated by the shielded housing 130, the shape of each radiation shielding insert 110 is independent of the shape of the component 120 that it protects. Further a radiation shielding insert 110 may protect more than one component 120. For example, radiation shielding insert 110c may be shaped and sized to shield both components 120c and 120d. FIG. 2B is a side view of the top of the shielded housing 130. This view indicates the varying depths of the radiation shielding inserts 110a, 110b, 110c and further illustrates the customization.

In the view of FIG. 2B, radiation shielding insert 110c is shown to include a pattern (e.g., a baffle 210) protruding from the surface. This baffle 210 creates a tortuous path for the unattenuated radiation 105 that reaches the volume 137 of the shielded housing 130 and further attenuates that radiation 105 before it reaches the components 120c and 120d. The surface patterns of the radiation shielding inserts 110 may be customized, like the shapes and sizes, based on the level of attenuation needed to protect the one or more components 120 being shielded by a given radiation shielding insert 110. The considerations involved in the design of each radiation shielding insert 110 are further discussed with reference to FIG. 3. The radiation shielding inserts 110 may be affixed to the shielded housing 130 by any known technique (e.g., fastening, adhering). FIG. 2B shows a fastener 220 that is inserted through the shielded housing 130 and threaded into the radiation shielding insert 110a.

Figure 3:
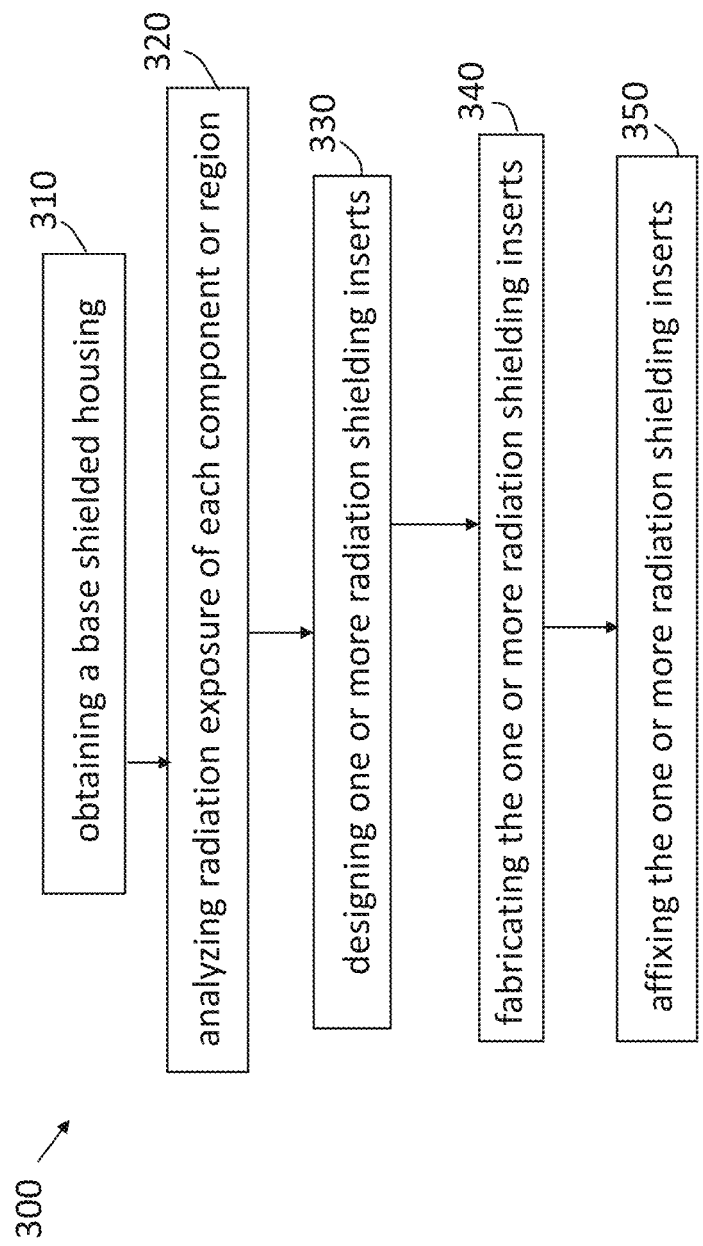
FIG. 3 is a process flow of a method of adaptively designing and fabricating radiation shielding inserts for electronic components according to one or more embodiments.

FIG. 3 is a process flow of a method 300 of adaptively designing and fabricating radiation shielding inserts for electronic components according to one or more embodiments. At block 310, obtaining a base shielded housing 130 may refer to obtaining one of several available standard designs based on information about the radiation 105 that the shielded housing 130 is expected to experience. As previously noted, the base shielded housing 130 may be selected such that some percentage of the components 120 within the shielded housing 130 will not require additional shielding, for example. The base shielded housing 130 attenuates a portion of the radiation 105 such that the remainder (i.e., unattenuated radiation) enters the volume 137 of the shielded housing 130. Based on the incident direction of the radiation 105, all regions of the volume 137 do not receive the same levels of unattenuated radiation.

At block 320, the processes include analyzing radiation exposure of each component 120 or region of the volume 137. This analysis may be performed using available tools and considers the orientation and location of the electronic assembly 100, 200 relative to incident radiation 105. As previously noted, the location may be a particular location within a spacecraft. Prior to finalizing the placement of the components 120, the analysis may be used to position components 120 such that the most radiation-susceptible components 120 are located in regions of the volume 137 that are exposed to the least radiation 105. Connectors and other parts that create areas 131 without shielding may be positioned based on the analysis, as well. Once the electronic assembly 100, 200 is designed, as a result of the analysis, the TID and TNID for each component 120 is known.

At block 330, designing one or more radiation shielding inserts 110 refers to determining a shape, thickness, and pattern of each radiation shielding insert 110 as well as its position relative to the one or more components 120 it is intended to shield. The shape, thickness, surface pattern, and position are all based on the level of attenuation of radiation 105 needed. The shape, thickness, surface pattern, and position to produce a given level of attenuation is also dependent on the material of the radiation shielding inserts 110. Exemplary materials include aluminum, titanium, and stainless steel. At block 340, fabricating the one or more radiation shielding inserts 110 may be via additive manufacturing (e.g., three-dimensional printing), for example. At block 350, affixing (e.g., fastening, adhering) the one or more radiation shielding inserts 110 to the inner surface 135 of the shielded housing 130 results in each of the radiation shielding inserts 110 protruding into the volume 137.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A method comprising:
obtaining a base housing for electronic components, the base housing being configured to attenuate radiation entering the base housing by a base amount, wherein an inner volume of the base housing defined by an inner surface of the base housing experiences attenuated radiation; and
affixing one or more inserts to the inner surface of the base housing to further attenuate the attenuated radiation in corresponding one or more areas of the inner volume by shielding one or more of the electronic components in the one or more areas of the inner volume from a total ionizing dose (TID) and total nonionizing dose (TNID) of radiation caused by interaction with radiation particles;
wherein a thickness of one of the one or more inserts is different than a thickness of another one of the one or more inserts to provide different shielding in different locations of the base housing and the thicknesses are based on a desired amount of radiation shielding in a particular location.

2. The method according to claim 1, wherein the performing the analysis considers a direction from which the radiation reaches the base housing.

3. The method according to claim 1, wherein the designing the one of the one or more inserts includes determining a shape and position such that the one of the one or more inserts is between the direction from which the radiation reaches the base housing and the one of the electronic components.

4. The method according to claim 3, wherein the designing the one of the one or more inserts includes determining a thickness to attenuate the attenuated radiation to a predetermined level.

5. The method according to claim 3, wherein the designing the one of the one or more inserts includes designing a pattern on a surface to create a tortuous path that further attenuates the attenuated radiation.

6. The method according to claim 1, further comprising fabricating the one or more inserts from aluminum, stainless steel, or titanium.

7. The method according to claim 1, further comprising fabricating the one or more inserts by implementing additive manufacturing.

8. The method according to claim 1, wherein the affixing the one or more inserts includes inserting a fastener through the base housing and into the one or more inserts.

9. A housing for electronic components, the housing comprising:
a base housing configured to attenuate radiation entering the base housing by a base amount, wherein an inner volume of the base housing defined by an inner surface of the base housing experiences attenuated radiation; and
one or more inserts affixed to the inner surface of the base housing to further attenuate the attenuated radiation in corresponding one or more areas of the inner volume by shielding one or more of the electronic components in the one or more areas of the inner volume from a total ionizing dose (TID) and total nonionizing dose (TNID) of radiation caused by interaction with radiation particles;
wherein a thickness of one of the one or more inserts is different than a thickness of another one of the one or more inserts to provide different shielding in different locations of the base housing and the thicknesses are based on a desired amount of radiation shielding in a particular location.

10. The housing according to claim 9, wherein each of the one or more inserts is between a direction from which the radiation reaches the base housing and the corresponding one of the one or more areas of the inner volume.

11. The housing according to claim 9, wherein the base housing comprises aluminum, stainless steel, or titanium.

12. The housing according to claim 9, wherein the one or more inserts comprises stainless steel, aluminum, or titanium.

13. The housing according to claim 9, wherein one of the one or more inserts includes a pattern on a surface of the one of the one or more inserts.

14. The housing according to claim 9, wherein the one or more inserts are fabricated using additive manufacturing.

15. The housing according to claim 9, wherein the one or more inserts are affixed to the base housing by a fastener inserted through the base housing and into the one or more inserts.

* * * * *